(12) United States Patent
Tanaka et al.

(10) Patent No.: US 7,521,299 B2
(45) Date of Patent: Apr. 21, 2009

(54) METHOD OF MANUFACTURING TRANSISTOR, METHOD OF MANUFACTURING ELECTRO-OPTICAL DEVICE, AND METHOD OF MANUFACTURING ELECTRONIC DEVICE

(75) Inventors: Hideki Tanaka, Chino (JP); Takashi Masuda, Suwa (JP); Ichio Yudasaka, Chino (JP); Takashi Aoki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 335 days.

(21) Appl. No.: 11/140,748

(22) Filed: Jun. 1, 2005

(65) Prior Publication Data

US 2006/0154406 A1 Jul. 13, 2006

(30) Foreign Application Priority Data

Jun. 2, 2004 (JP) ............................. 2004-165007
Aug. 20, 2004 (JP) ............................. 2004-240354

(51) Int. Cl.
*H01L 21/84* (2006.01)
(52) U.S. Cl. ................... 438/151; 438/99; 257/E51.006
(58) Field of Classification Search ................. 438/493, 438/151, 479, 99, 149, 703; 257/40, 66–70, 257/E51.001–E51.011, E51.025–E51.026, 257/E51.052
See application file for complete search history.

(56) References Cited

U.S. PATENT DOCUMENTS

| | | | | |
|---|---|---|---|---|
| 5,328,560 | A * | 7/1994 | Hanawa et al. | 438/516 |
| 6,864,133 | B2 * | 3/2005 | Aoki et al. | 438/197 |
| 7,405,134 | B2 * | 7/2008 | Yudasaka et al. | 438/401 |
| 2003/0029831 | A1 * | 2/2003 | Kawase | 216/27 |
| 2003/0219934 | A1 * | 11/2003 | Furusawa | 438/158 |
| 2004/0029382 | A1 * | 2/2004 | Kawase | 438/689 |
| 2004/0129978 | A1 * | 7/2004 | Hirai | 257/347 |
| 2004/0263739 | A1 * | 12/2004 | Sirringhaus et al. | 349/135 |

(Continued)

FOREIGN PATENT DOCUMENTS

JP    A 5-63194    3/1993

(Continued)

OTHER PUBLICATIONS

Shimoda, T. and Kawase, T. "All-Polymer Thin Film Transistor Fabricated By High-Resolution Ink-Jet Printing." Solid-State Circuits Conference, 2004. Digest of Technical Papers, vol. 1, ISSCC 2004, Session 16 (Feb. 15-19, 2004).*

(Continued)

*Primary Examiner*—Douglas M Menz
*Assistant Examiner*—Matthew W Such
(74) *Attorney, Agent, or Firm*—Oliff & Berridge, PLC

(57) ABSTRACT

A method of manufacturing a transistor includes disposing a droplet containing a bank material as a solute or a dispersoid on a substrate, drying the droplet to form a bank, ejecting a conductive material on a part of the bank to form a first conductive region and a second conductive region with the part of the bank interposed therebetween, removing the bank to form a groove between the first and second conductive regions, supplying a semiconductor material into the groove to form a semiconductor film, forming a gate insulating film on the semiconductor film, and forming a gate electrode at a position on the gate insulating film facing the semiconductor film.

5 Claims, 12 Drawing Sheets

U.S. PATENT DOCUMENTS

| | | | |
|---|---|---|---|
| 2005/0064091 A1* | 3/2005 | Yamazaki | 427/58 |
| 2005/0170643 A1* | 8/2005 | Fujii et al. | 438/637 |
| 2006/0037935 A1* | 2/2006 | Aoki et al. | 216/13 |
| 2006/0084206 A1* | 4/2006 | Moriya et al. | 438/149 |
| 2006/0160276 A1* | 7/2006 | Brown et al. | 438/149 |
| 2006/0166411 A1* | 7/2006 | Morisue et al. | 438/149 |

FOREIGN PATENT DOCUMENTS

| | | |
|---|---|---|
| JP | A 2002-76358 | 3/2002 |
| WO | WO 02/073712 A1 | 9/2002 |
| WO | WO 2004110105 A1 * | 12/2004 |

OTHER PUBLICATIONS

Yang, J.Z., et al. "Polymer Field Effect Transistors Fabricated By Dewetting." Synth. Met., vol. 146 (2004): pp. 287-290.*

* cited by examiner

Prior Art

METHOD OF MANUFACTURING TRANSISTOR, METHOD OF MANUFACTURING ELECTRO-OPTICAL DEVICE, AND METHOD OF MANUFACTURING ELECTRONIC DEVICE

This application claims benefit of Japanese Patent Application No. 2004-165007 filed on Jun. 2, 2004 and Japanese Patent Application No. 2004-240354 filed on Aug. 20, 2004. The entire disclosure of the prior applications is hereby incorporated by reference herein in its entirety.

BACKGROUND

The present invention relates to a method of manufacturing a transistor.

Attention has been focused on how to achieve a fast operating speed in development of a transistor. FIG. 12 is a diagram illustrating a structure of a typical metal oxide semiconductor (MOS) transistor 1. The MOS transistor 1 is, for example, formed on a glass substrate 2, and includes a semiconductor film 3, an insulating film 4, a gate insulating film 5, a gate electrode 6, a source electrode 7, a drain electrode 8, and an insulating film 9.

In such a MOS transistor 1, when the distance (that is, a channel length Lc shown in FIG. 12) of a channel region right below the gate electrode 6 becomes shorter, the operating speed becomes faster in response to the distance. In order to achieve a fast operating speed, a photolithography technique is used to achieve a short channel length in the related art (for example, Japanese Unexamined Patent Application Publication No. 2002-76358).

However, in a case of using the photolithography technique, since the yield is deteriorated and an expensive exposure device is additionally required, there is a problem in that the manufacturing cost increases. In addition, since most of a resist material is removed after being applied on the entire surface of a substrate, a large amount of resist material is wasted, which results in a high cost.

SUMMARY

An advantage of the invention is that it provides a method of manufacturing a transistor which is capable of readily manufacturing a transistor with a short channel length at a low cost.

According to an aspect of the invention, there is provided a method of manufacturing a transistor including: disposing a droplet containing a bank material as a solute or a dispersoid on a substrate; drying the droplet to form a bank; ejecting a conductive material on a part of the bank to form a first conductive region and a second conductive region with the part of the bank interposed therebetween; removing the bank to form a groove between the first and second conductive regions; supplying a semiconductor material into the groove to form a semiconductor film; forming a gate insulating film on the semiconductor film; and forming a gate electrode at a position on the gate insulating film facing the semiconductor film.

According to this aspect, the droplet of the liquid material containing the bank material is dried to form the bank, and a groove (groove in the sub-micron order) is formed between the first and second conductive regions using the bank, and the semiconductor material is then supplied to the groove to form the semiconductor film. Since a width of the semiconductor film corresponds to a channel length, the transistor with a short channel length at a low cost can be formed. In this case, the first and second conductive regions mean source and drain regions of the transistor, respectively. A method of forming the first and second conductive regions, besides the method of forming the source and drain electrode with the electrode material, may include a method of forming each region and then doping impurities (a so-called ion implantation method), such that the first and second conductive regions may become the source and drain regions.

According to another aspect of the invention, there is provided a method of manufacturing a transistor including: forming a semiconductor film on a substrate; disposing a droplet containing a bank material as a solute or a dispersoid on the semiconductor film; drying the droplet to form a bank; etching the semiconductor film using the bank as a mask; ejecting a conductive material on a part of the bank to form a first conductive region and a second conductive region with the part of the bank interposed therebetween; and removing the bank to form a gate insulating film and a gate electrode on the semiconductor film after the forming of the first and second conductive regions.

According to this aspect, since the semiconductor film is previously formed on the substrate and an unnecessary portion is removed using the bank as a mask to form the semiconductor film, the semiconductor film can be simply formed as compared to the above-mentioned case of supplying the semiconductor material to the groove pattern to form the semiconductor film.

Further, it is preferable that the forming of the bank include forming the bank at the periphery of a center of the droplet and the periphery surrounding the center. In addition, preferably, the forming of the bank may include setting the content of the bank material contained in the droplet to be high, or may include setting a drying speed of the droplet to be high.

Furthermore, it is preferable that the forming of the bank include forming a surface modifying film on the bank, and an affinity of the surface modifying film to the conductive material be lower than an affinity of the bank to the conductive material.

In this case, since the surface modifying film, such as a self-assembled monolayer (SAM), having a low affinity to the electrode material is formed on the bank, the electrode material can be surely prevented from remaining on the bank.

Further, it is preferable that a thickness of the bank be larger than a thickness of any one of the first and second conductive regions.

Furthermore, the gate insulating film is preferably formed by a coating method using a liquid material containing perhydropolysilazane. In this case, the coating method may include a spin coating method for applying the liquid material by means of spin coating, and an inkjet method using inkjet, but a coating method may be changed and set.

In addition, a transistor may also be manufactured with the above-mentioned method of manufacturing the transistor, and an electronic circuit having the transistor may be manufactured. In this case, the electronic circuit means various circuits used for driving circuits for driving various electro-optical devices (for example, a liquid crystal element, an electrophoresis element having a disperse medium in which electrophoresis particles are dispersed, and a device having an electroluminescent (EL) element).

In addition, the electronic device means a general apparatus device with a predetermined function having the transistor according to the invention, and includes, for example, an electro-optical device or a memory. The structure of the electronic device is not particularly limited, but may include an IC card, a cellular phone, a video camera, a personal computer, a head mount display, a rear or front type projector, a facsimile having a display function, a finder of a digital camera, a portable TV, a digital signal processor (DSP), a personal digital assistant (PDA), an electronic note, an electric bulletin board, an ad and public announcement display and so forth.

BRIEF DESCRIPTION OF THE DRAWINGS

The invention will be described with reference to the accompanying drawings, wherein like numbers reference like elements, and wherein.

DETAILED DESCRIPTION OF EMBODIMENTS

Hereinafter, the basic principle of the invention will be described before explaining embodiments according to the invention.

Basic Principle

Figure 1A:
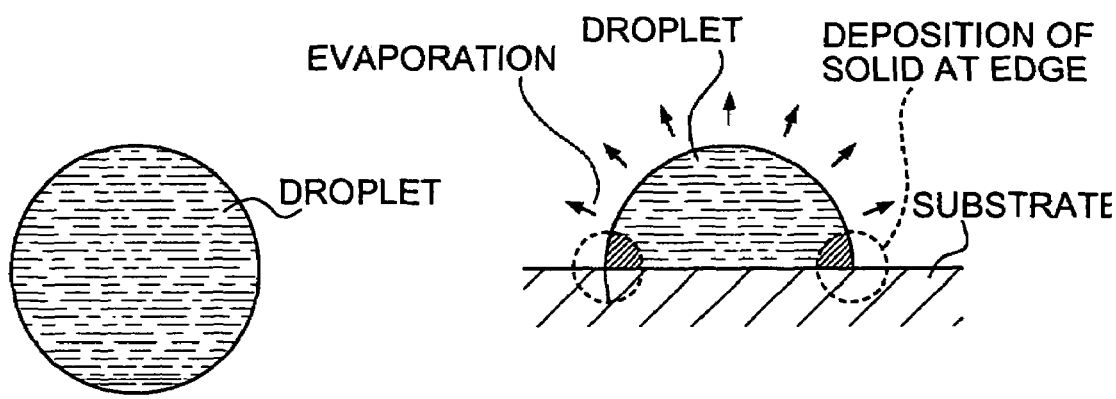
FIG. 1 is a diagram illustrating the basic principle of the invention.
Figure 1B:
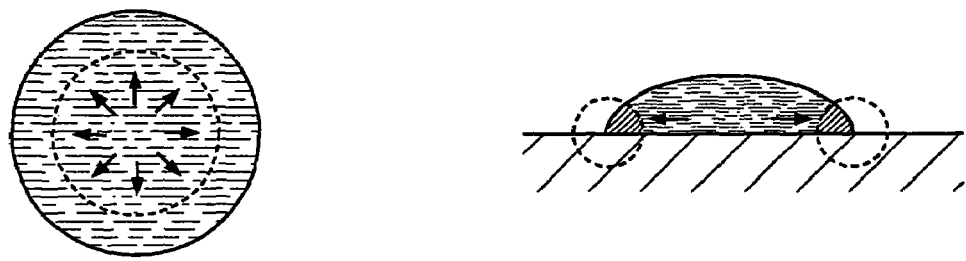
Figure 1C:
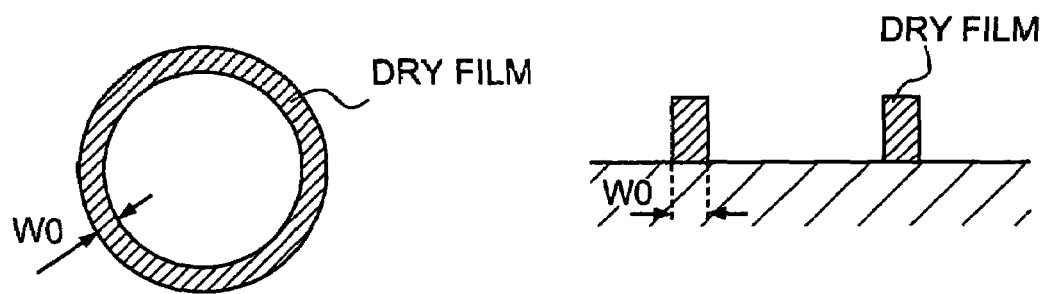

FIG. 1 is a diagram illustrating a process of forming a thin film using a droplet drying method associated with the basic principle of the invention. Since the droplet drying method is one of the thin film forming methods used in the process of manufacturing an electronic apparatus or the like, which does not require an expensive exposure device, there are merits in that the cost can be significantly suppressed as compared to the photolithography technique, and there is less wastage of the liquid material as compared to a spin coating method.

According to this droplet drying method, during a process of drying the droplet, at least one of the drying speed of the liquid and the solid concentration of the liquid material is used as a parameter, so that the dry film of the droplet is controlled in various shapes. Through this control, a ring-shaped dry film in which the solid is locally deposited at the edge of the droplet may be formed on a substrate (see FIGS. 1A to 1C), or the parameter may be controlled so as to make the solid concentration of all droplets reach a saturation concentration approximately at the same time, so that it is possible to form a dry film (not shown) in which all droplets contract. Furthermore, a plurality of droplets are dropped on the substrate while continuously moving the droplets, so that a linear dry film in which the solid is locally deposited at the edge of the droplet may be formed on the substrate.

The condition for forming the ring-shaped dry film as shown in FIG. 1 is used in the respective embodiments described below. However, the invention is not limited thereto, and may use a condition for forming the linear dry film. In addition, changing the parameter, the diameter of fine particles, and the like can control the width or thickness of the ring-shaped dry film. For example, when the solid concentration of the liquid material is set to be high, it is difficult to be affected by the liquid flow toward the edge from the center. As a result, it is possible to form a dry film in which a width W0 of a protruding portion of the edge is small (sub-micron order).

When the droplet drying method for forming the dry film is described in brief, the droplet disposed on a solid phase substrate is typically subject to faster drying at its edge. Accordingly, when the droplet contains a solute or dispersoid (hereinafter, referred to as the 'solute'), in the process of drying the droplet, the concentration of the solute at the edge of the droplet first reaches a saturated concentration and is then deposited. On the other hand, the liquid flow from the center of the droplet toward the edge occurs within the droplet so as to supply the liquid lost by evaporation at the edge of the droplet, and the solute at the center of the droplet moves toward the edge according to the flow, so that the deposition from the edge is accelerated according to the droplet drying. Therefore, a phenomenon in which the solute contained in the droplet becomes deposited in a ring shape around the periphery of the droplet disposed on the substrate is called 'peening'.

In the present embodiment, the ring-shaped dry film is formed at the edge of the droplet by means of the peening phenomenon, and a groove pattern controlled in sub-micron order is formed between a source electrode (source region) and a drain electrode (drain region) of the thin film transistor, and a semiconductor material is supplied to the groove pattern to form a semiconductor layer. Since the width of the semiconductor layer corresponds to a channel length of the thin film transistor, the thin film transistor having a channel length of submicron order is finally formed.

A. First Embodiment

Figure 2:
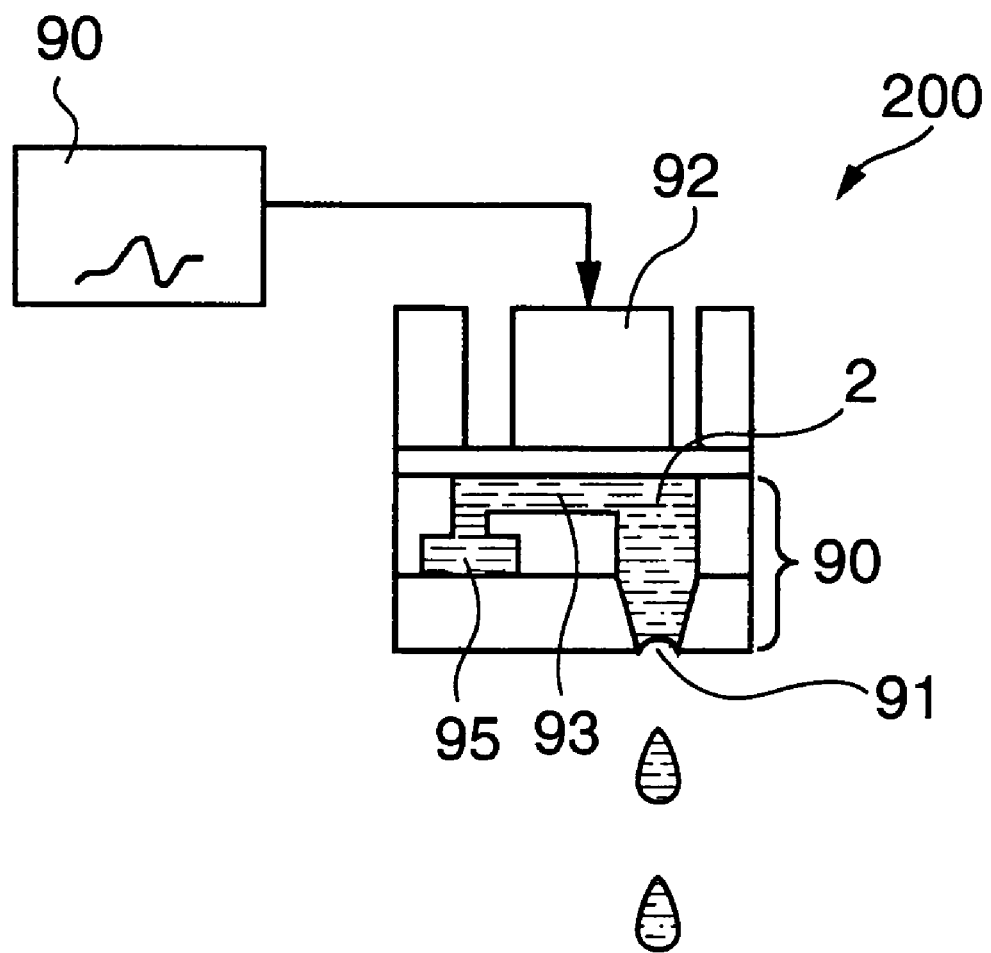
FIG. 2 is a diagram illustrating a structure of an inkjet head according to an embodiment of the invention.

FIG. 2 is a diagram illustrating the structure of an inkjet head 200 according to the first embodiment. The inkjet head 200 allows a liquid material 2 containing a bank material to be ejected from the nozzle 91 toward a substrate 10 by means of a droplet ejection method. In this case, the bank indicates a protrusion serving as a partition member, and a material for forming the bank is called a bank material. In addition, a resin material, such as resist, may be used for the bank material, but any material may be used so long as it has an insulating property.

In the inkjet head 200, a droplet ejection method, which is a piezo method, is employed; in this method, the liquid material 2 is ejected by means of a piezo element. The employed droplet ejection method is not limited to the piezo method, however, and various methods of ejecting the liquid material 2 with bubbles generated from the heated liquid material 2 may be employed.

A reservoir 95 and a plurality of ink chambers 93 branched off from the reservoir 95 are formed in a head main body 90 of the inkjet head 200. The reservoir 95 is a flow path for supplying the liquid material 2 to each ink chamber 93. In addition, a nozzle plate constituting an ink ejection surface is disposed at a lower end surface of the head main body 90, and a plurality of nozzles 91 for ejecting the liquid material 2 are formed to correspond to the respective ink chambers 93 in the nozzle plate. A piezo element 92 has a structure in which a piezo material such as quartz is inserted between a pair of electrodes (not shown). Here, the pair of electrodes is connected to a driving circuit 99.

In this case, when a voltage is applied from the driving circuit 99 to the piezo element 92, the piezo element 92 is expanded or contracted. When the piezo element 92 is contracted, the pressure of the ink chamber 93 decreases to allow the liquid material 2 to flow from the reservoir 95 into the ink chamber 93, and when the piezo element 92 is expanded, the pressure of the ink chamber 93 increases to allow the liquid material 2 to be ejected from the nozzle 91. By using the inkjet head 200 having the above-mentioned structure, a droplet of the liquid material containing the bank material is dropped at a predetermined position of the substrate 10. Hereinafter, a process of manufacturing the thin film transistor according to the first embodiment will be described with reference to FIGS. 3 and 4.

Process of Forming Bank

Figure 3A:
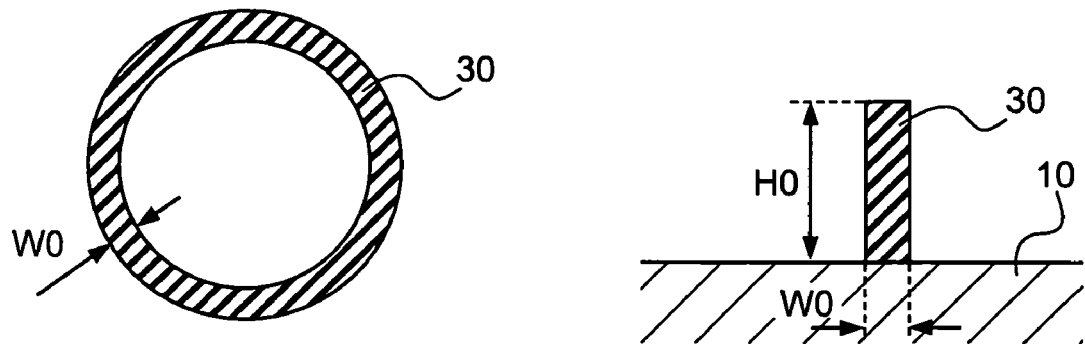
FIG. 3 is a diagram illustrating a process of manufacturing a thin film transistor according to the first embodiment.

When at least one of the solid concentration and the drying speed of the liquid material 2 is controlled in the process of drying the dropped droplet after the liquid material 2 containing the bank material is dropped on the substrate 10, a ring-shaped bank 30 shown in FIG. 3A can be formed (refer to the basic principle for details). In addition, in the present embodiment, selection or the concentration of the bank material is set so as to make a thickness H0 of the bank 30 larger than a thickness H1 of an electrode 40 to be described below (see FIG. 3B).

Process of Forming Electrode

Figure 3B:
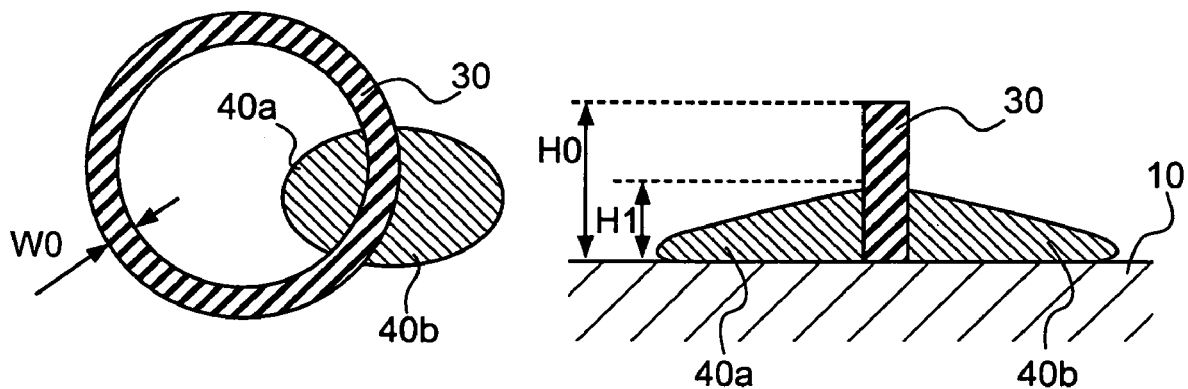
Figure 3C:
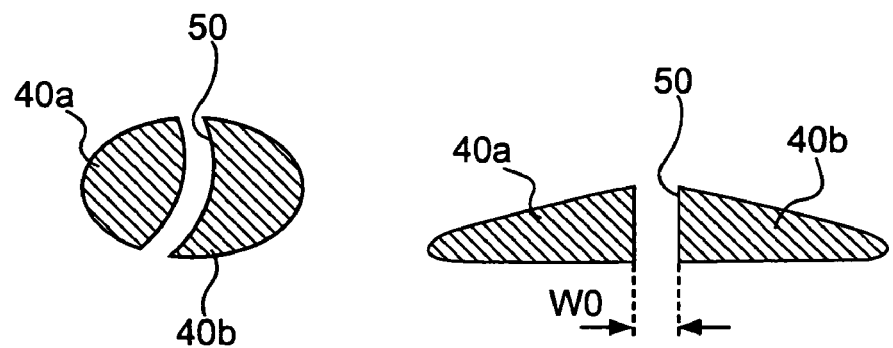

When the ring-shaped bank 30 is formed on the substrate 10, the electrode 40 is formed of aluminum or copper with a part of the bank 30 located within the electrode 40 (see FIG. 3B). Similar to the bank 30, the electrode 40 may also be formed by ejecting a liquid material containing an electrode material from a nozzle of the inkjet head, or may be formed using a vapor phase method, such as a PVD method and a CVD method. The substrate 10 on which the electrode material is applied is then fired, a source electrode 40a is formed at one side (for example, an inner side of the bank 30) and a drain electrode 40b is formed at the other side (for example, an outer side of the bank 30) with the bank 30 interposed therebetween.

Process of Removing Bank

When the electrode 40 is formed, the bank 30 is removed from the substrate 10 by using wet etching. As a result, a groove pattern 50 is formed between the source electrode 40a and the drain electrode 40b in accordance with the width W0 of the bank 30 shown in FIG. 3C. In addition, dry etching, as well as the wet etching, may also be employed when the bank 30 can be removed from the substrate 10.

Process of Forming Semiconductor Film

When the groove pattern 50 is formed between the source electrode 40a and the drain electrode 40b, a semiconductor material, such as liquid silicon containing cyclopentasilane, is supplied to the groove pattern 50 by using a droplet ejection method. In addition, the semiconductor material supplied to the groove pattern 50 is fired to form a semiconductor film 60 to be a channel region (see FIG. 4A). In addition, a vapor phase method, such as a PVD method and a CVD method, may be employed instead of the droplet ejection method.

Process of Forming Gate Insulating Film

Figure 4A:
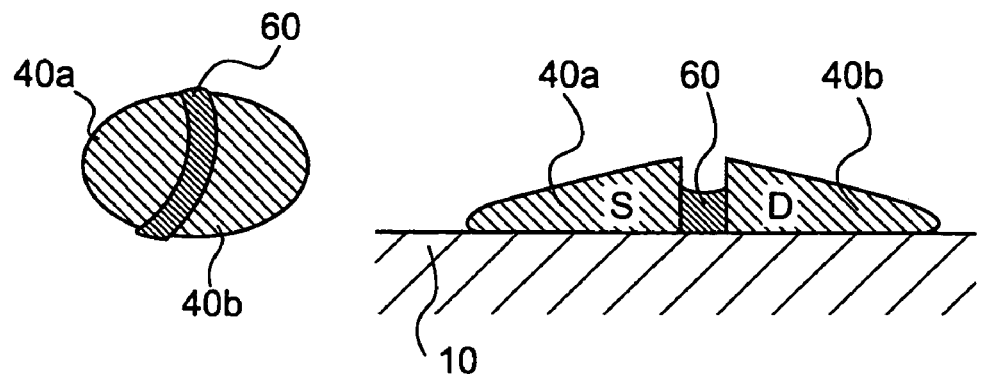
FIG. 4 is a diagram illustrating a process of manufacturing a thin film transistor according to the first embodiment.
Figure 4B:
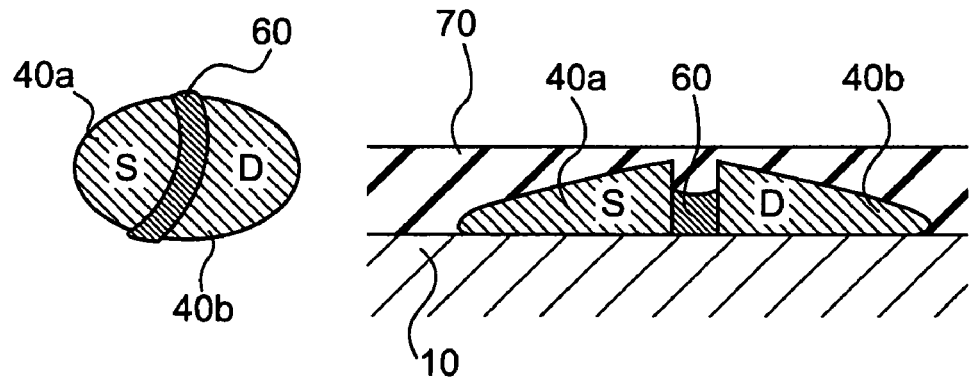

Next, a gate insulating film 70 is formed on one surface of the substrate 10 including the source electrode 40a, the semiconductor film 60, and the drain electrode 40b, which is polished to form a surface with high flatness (see FIG. 4B). A method of forming the gate insulating film 70 may include, for example, a method of applying a liquid material on approximately the entire surface of the substrate 10 including the source electrode 40a, the semiconductor film 60, and the drain electrode 40b by means of the spin coating method and then firing the applied liquid material to solidify it. For example, the liquid material uses a material obtained by dissolving perhydropolysilazane with an organic solvent (for example, xylene solution of 20%), and this liquid material is applied by the spin coating method (for example, at 2000 rpm and for 20 seconds) and then fired in air at a temperature of about 450° C., thereby forming a thick silicon oxide film (that is, a gate insulating film 70).

In addition, by polishing the formed gate insulating film 70 to decrease its thickness, a surface with high flatness is obtained. A method of decreasing the thickness may employ a CMP method (chemical mechanical polishing), and its particular conditions may be such that a combination of a pad formed of soft polyurethane and a polishing agent (slurry) in which silica particles are dispersed in an ammonia based or amine based alkali solution is used, and the pressure is 30000 Pa, the rotation speed is 50 rpm, and the flow rate of the polishing agent is 200 sccm.

In addition, besides the above-mentioned method of forming the silicon oxide film, for example, an appropriate amount of photosensitive polysilazane, which is a liquid material, is dropped on the substrate 10 and is applied by a spin coating method (for example, at 1000 rpm and for 20 seconds), and is then fired at a temperature of about 100° C. to obtain the silicon oxide film. In addition, instead of forming the silicon oxide film using the liquid material, the silicon oxide film may be formed using the CVD method. When the CVD method is employed, a plasma enhanced CVD (PECVD) method is particularly suitable, and conditions for forming a film can be applied as described below. For example, the following conditions are used: tetraethyoxysilane (TEOS) and oxygen ($O_2$) are used as source gases, and the respective flow rates correspond to 200 sccm and 5 slm, the atmosphere temperature is 350° C., the RF power is 1.3 kW, and the pressure is 200 Pa. As a result, it is possible to form the silicon oxide film at a fast film-forming speed of about 300 nm/min. In addition, other conditions may also be used, for example: monosilane ($SiH_4$), nitrous oxide ($N_2O$), and argon (Ar) are used as the source gas, the respective flow rates correspond to 160 sccm, 3 slm, and 5 slm, the atmosphere temperature is 400° C., the RF power is 800 W, and the pressures is 170 Pa. Further, in this case, the silicon oxide film can be formed at a fast film-forming speed of about 300 nm/min.

Process of Forming Gate Electrode

Figure 4C:
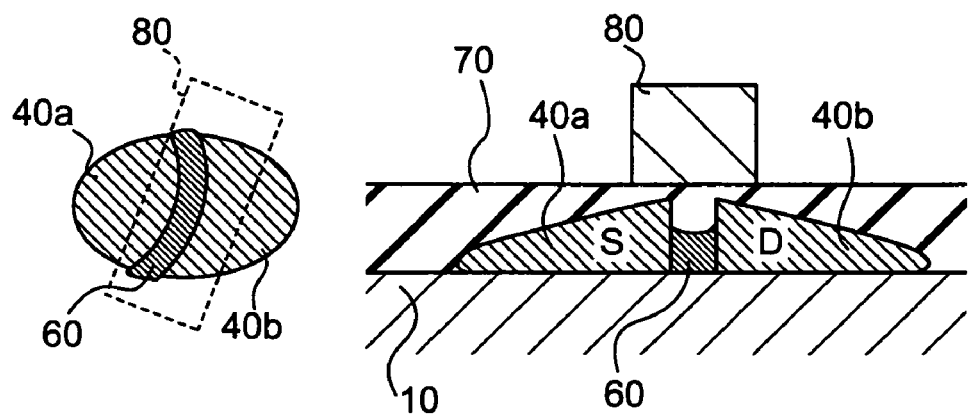

Next, a thin metal film made of tantalum, chromium, aluminum or the like is formed by a sputtering method and then patterned, so that a gate electrode 80 is formed at a position on the gate insulating film 70 facing the semiconductor film 60, as shown in FIG. 4C. In addition, a droplet ejection method or a CVD method instead of the sputtering method may be employed to form the gate electrode 80.

Through the above-mentioned processes, a field effect-type thin film transistor can be obtained by laminating the semiconductor film, the gate insulating film, and the electrode formed according to the width W0 of the bank.

As described above, according to the present embodiment, the droplet drying method is employed to form the groove pattern 50 controlled to sub-micron order, and a semiconductor material is supplied to the groove pattern 50 to form the semiconductor film 60. Since the width of the semiconductor film 60 corresponds to a channel length of the thin film transistor, it is possible to obtain a thin film transistor having a channel length of sub-micron order without using an expensive exposure device. In addition, since the electrode 40 formed of aluminum or copper is directly formed on the substrate 10 in the present embodiment, an ion implantation process (that is, a process necessary when the electrode is formed by implanting impurity ions serving as donors or acceptors into the semiconductor film) may be omitted.

In addition, the liquid material containing the electrode material is applied to form the source and drain electrodes in the above-mentioned first embodiment; however, a method of doping impurities (a so-called ion implanting method) in predetermined regions of the semiconductor film may be employed to form source and drain regions, thereby forming source and drain electrodes.

B. Second Embodiment

Figure 5A:
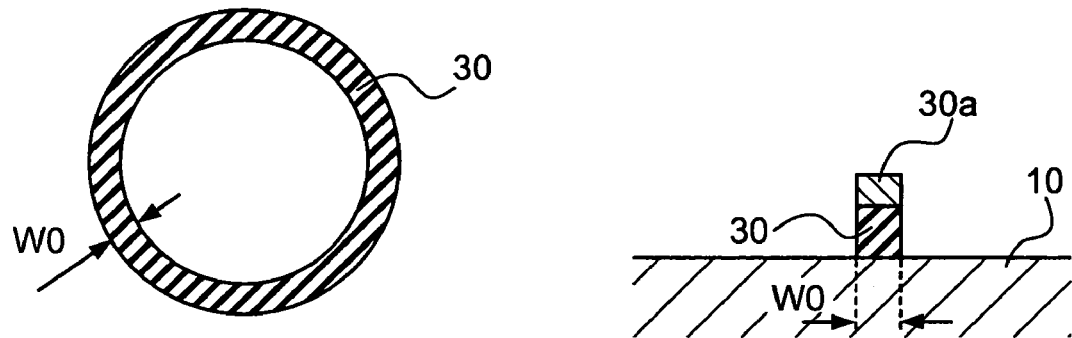
FIG. 5 is a diagram illustrating a process of manufacturing a thin film transistor according to a second embodiment.
Figure 5B:
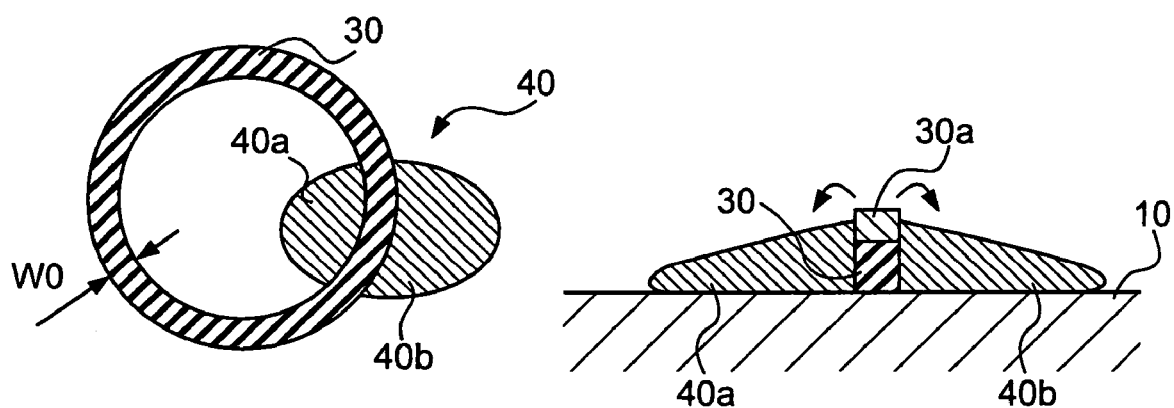
Figure 5C:
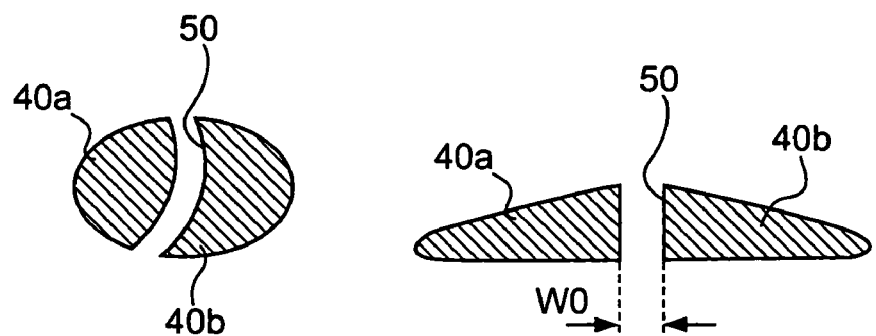

FIG. 5 is a diagram illustrating a process of manufacturing a thin film transistor according to a second embodiment, which corresponds to FIG. 3. In addition, constituent elements corresponding to the constituent elements of FIG. 3 are denoted by the same reference numerals, and detailed description thereof will be omitted.

The first embodiment sets the selection or concentration of the bank material so as to make the thickness H0 of the bank 30 larger than the thickness H1 of the electrode 40 (see FIG. 3B), however, a self-assembled monolayer (SAM) 30a having a low affinity to the electrode material constituting the electrode 40 (source electrode 40a and drain electrode 40b) is formed on the bank 30 in the present embodiment (see FIG. 5A). This SAM 30a is a film (surface modifying film) manufactured by a method of fixing the molecule on a solid surface, such as a self-assembly (SA) method capable of forming a molecule layer with high alignment and high density. In addition, the SAM 30a may be formed by a vapor phase growth method, such as a CVD method, or by a method using a liquid phase, such as a spin coating method and a dipping method.

As such, the SAM 30a having a low affinity to the electrode material is formed on the bank 30, and a liquid becoming the electrode material is then supplied on the substrate 10 by the droplet ejection method. The liquid (electrode material) supplied on the substrate 10 is subject to resilient reaction from the SAM 30a, and the source electrode 40a and the drain electrode 40b are formed with a part of the bank 30 interposed therebetween (see FIG. 5B). Since the SAM 30a formed on the bank 30 is naturally removed by heating, a process of removing the SAM 30a is not necessary. In addition, since a process after formation of the electrode 40 can be described in the same manner as the first embodiment, its description will be omitted. Further, in the method according to the second embodiment, a thin film transistor having a channel length of sub-micron order can be obtained without requiring an expensive exposure device.

C. Third Embodiment

Figure 6A:
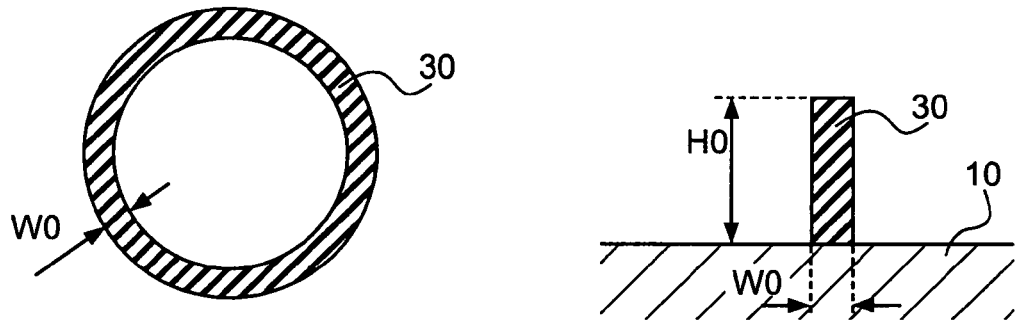
FIG. 6 is a diagram illustrating a process of manufacturing a thin film transistor according to a third embodiment.
Figure 6B:
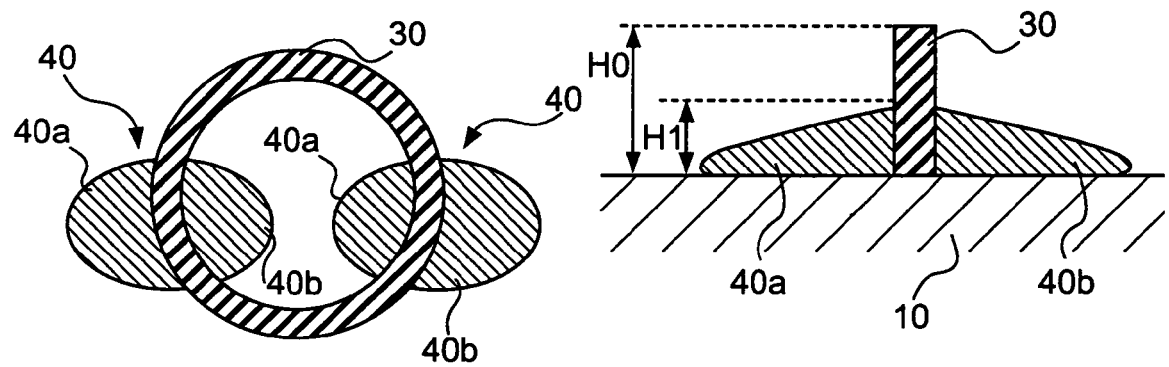

FIG. 6 is a diagram illustrating a process of manufacturing a thin film transistor according to a third embodiment of the invention, which corresponds to FIG. 3. In addition, since constituent elements corresponding to the constituent element of FIG. 3 are denoted by the same reference numerals, its detailed description will be omitted.

One pair of electrodes 40 composed of the source electrode 40a and the drain electrode 40b (hereinafter, referred to as electrode pair 40) are formed with a part of the bank 30 interposed therebetween in the above-mentioned first embodiment, however, a plurality of the electrode pairs 40 (two pairs in FIG. 6) are formed with the part of the bank 30 interposed therebetween in the present embodiment. In addition, the electrode pairs are two in the present embodiment. However, three, four, or more pairs may be employed.

In addition, at the time of forming the bank 30, the droplets are continuously dropped while it is a little shifted at a time interval faster than a drying time of the droplet containing the bank material. Specifically, before the previously dropped droplets are dried to form the bank at the edge of the droplet, a next droplet is dropped so as to overlap a part of the previously dropped droplets. Each dropped droplet is mixed by means of wetting and spreading, so that an approximately straight line-shaped bank is continuously formed at the edge of each droplet. A plurality of electrode pairs 40 may also be formed with a part of the elongated bank interposed between the electrodes.

Figure 6C:
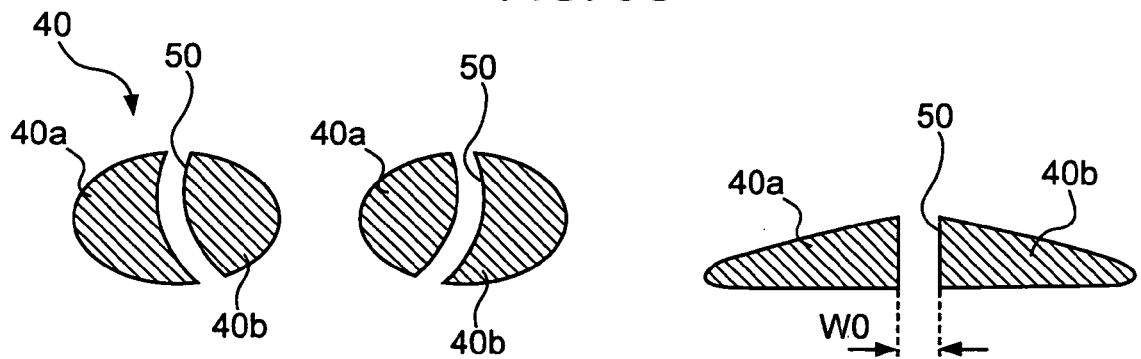
Figure 7:
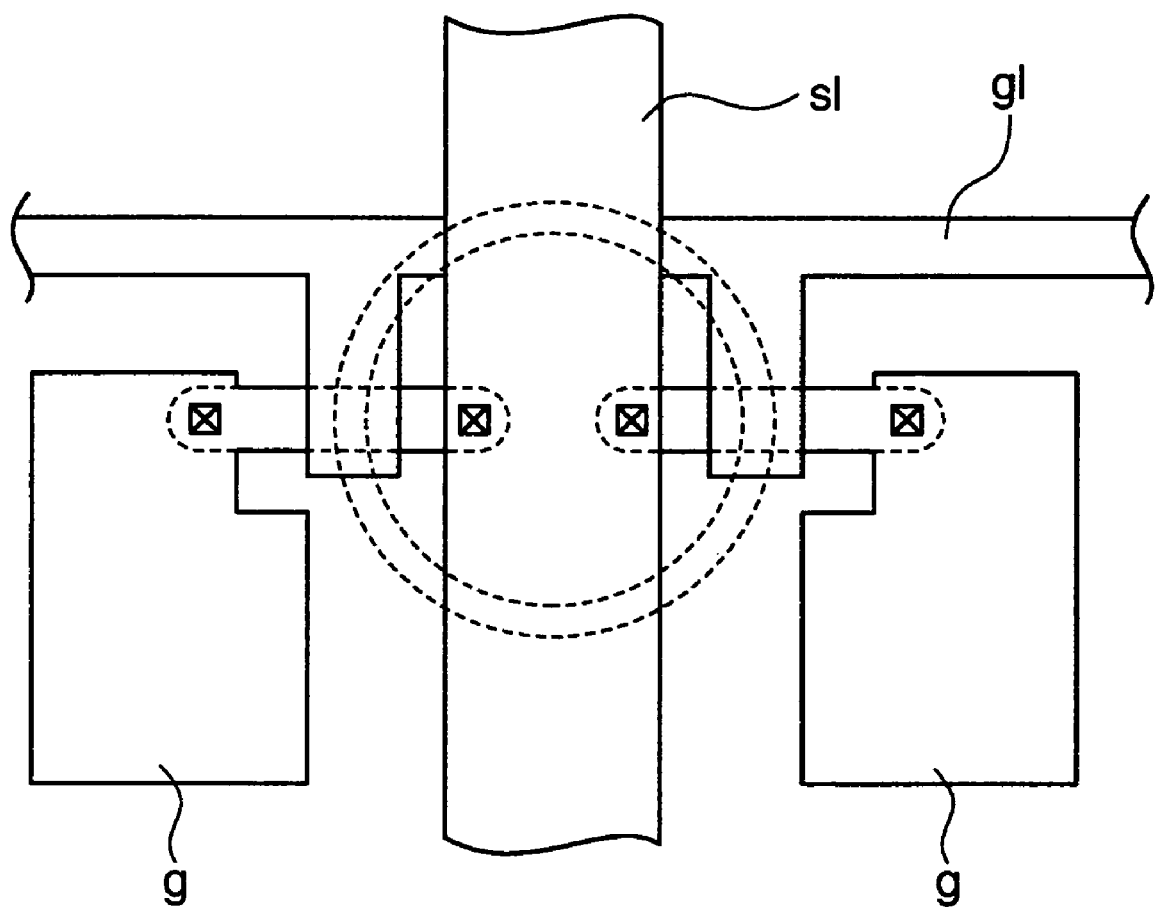
FIG. 7 is a diagram illustrating a pattern of a metal wiring line according to a third embodiment.

In this case, a plurality of electrode pairs 40 composed of the source electrode 40a and the drain electrode 40b are formed in a process of forming electrodes with a part of the bank 30 interposed between the electrodes (see FIG. 6B), and the groove pattern 50 is formed in a process of removing the bank between the source electrode 40a and the drain electrode 40b which constitute each electrode pair 40 (see FIG. 6C). In addition, a semiconductor material is implanted into each groove pattern in a process of forming a semiconductor film, and a gate insulating film is formed on each semiconductor film in a process of forming a gate insulating film, and a gate electrode is formed at a position facing each semiconductor film on the gate insulating film in a process of forming the gate electrode. A metallic wiring film formed of, for example, aluminum is then formed and a metallic wiring line is arranged using a metal photomask as shown in FIG. 7. Specifically, the source electrode is electrically connected to a source wring line s1 via a contact hole while the drain electrode is electrically connected to a pixel electrode g with the bank interposed therebetween. In addition, the gate electrode is formed of a gate wiring line g1. In FIG. 7, the same wiring line is electrically connected to the respective source electrodes. However, each source electrode may be electrically connected to a different wiring line. In addition, an inversed structure may be employed for the source and drain electrodes with the bank interposed therebetween, and in this case, an outer side shown by a broken line in FIG. 7 corresponds to the source electrode and each drain electrode is electrically connected to each metallic wiring line.

In addition, the formed MOS transistor may be any one of an N-channel MOS transistor and a P-channel MOS transistor, and a complementary MOS (CMOS) transistor may be formed by combining the N-channel MOS transistor and the P-channel MOS transistor. Further, in the method according to the third embodiment as described above, a thin film transistor having a channel length of sub-micron order can be obtained without requiring an expensive exposure device.

D. Fourth Embodiment

In the above-mentioned first embodiment, as shown in FIG. 4A, the semiconductor material is supplied to the groove pattern 50 between the source electrode 40a and the drain electrode 40b, which is fired to form the semiconductor film 60. However, the width of the groove pattern 50 is controlled to sub-micron order, so that it is difficult to supply the semiconductor material to the groove pattern 50 and form the semiconductor film 60. To overcome this problem, a process of manufacturing the thin film transistor is shown in FIGS. 8 and 9.

FIGS. 8 and 9 are diagrams illustrating a process of manufacturing a thin film transistor according to a fourth embodiment of the invention. In addition, constituent elements of FIGS. 8 and 9 corresponding to the constituent elements of FIGS. 3 and 4 are denoted by the same reference numerals, and its detailed description will be omitted.

Process of Forming a Semiconductor Film

Figure 8A:
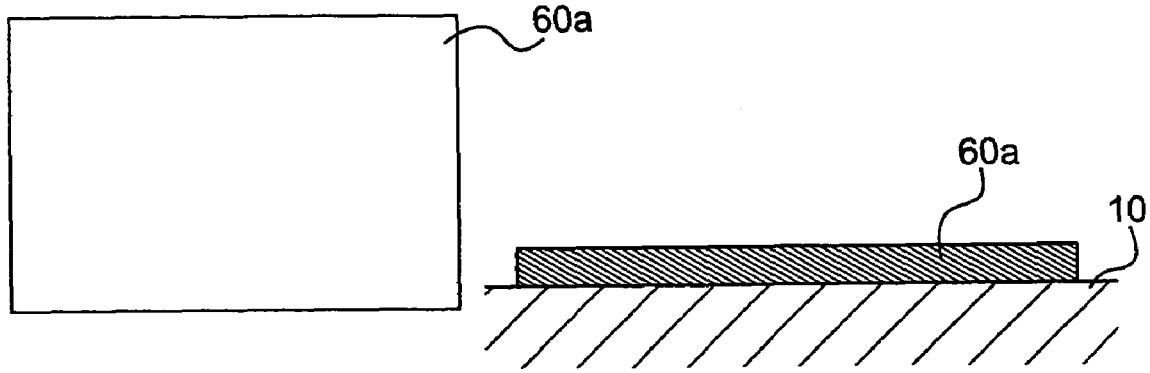
FIG. 8 is a diagram illustrating a process of manufacturing a thin film transistor according to a fourth embodiment.

First, a semiconductor film (silicon film) 60a is formed on the entire surface of the substrate 10 using a CVD method or a coating method (see FIG. 8A). In addition, an excimer laser annealing process is carried out if necessary to crystallize it to be the polysilicon film.

Process of Forming Bank

Figure 8B:
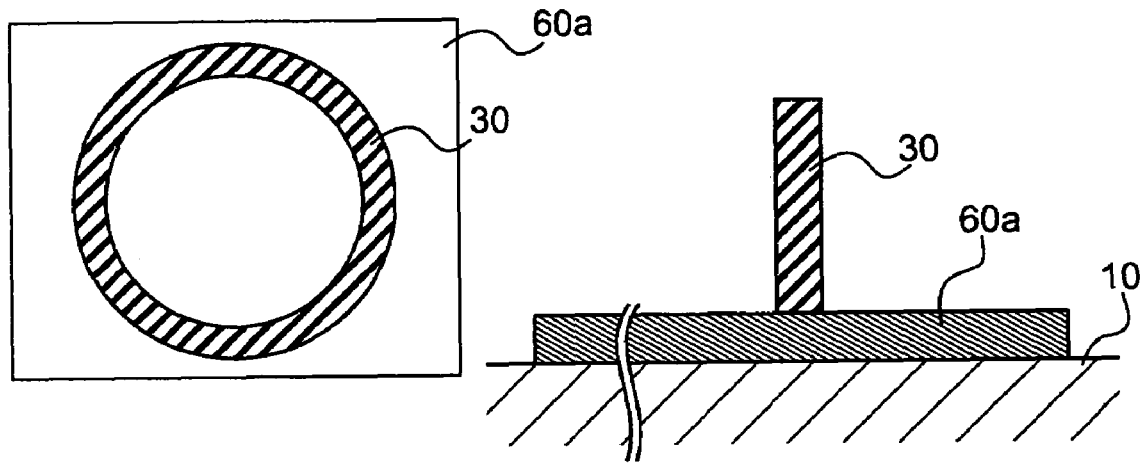

Next, as in the first embodiment, a liquid material 2 containing a bank material is dropped at a predetermined position of the substrate 10 in which the semiconductor film 60a is formed. During the process of drying the dropped droplet, at least one of the solid concentration and the drying speed of the liquid material is controlled, thereby forming a ring-shaped bank 30 as shown in FIG. 8B.

Etching Process

Figure 8C:
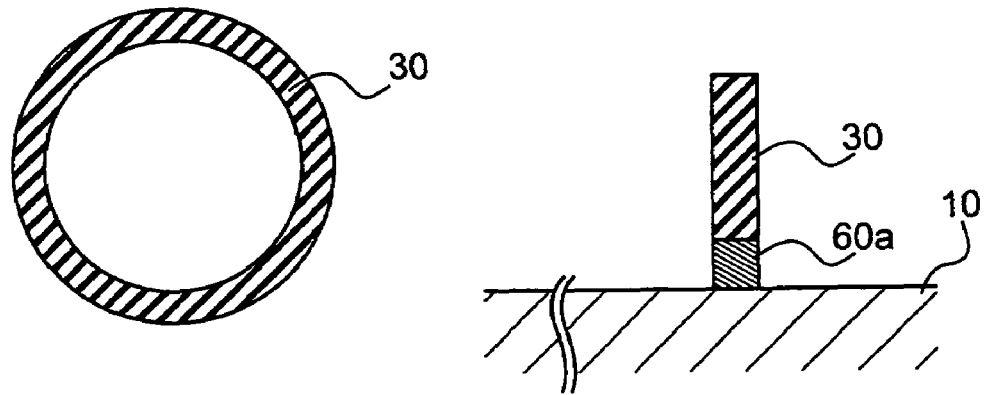

Next, etching is carried out on the semiconductor film 60a using the above-mentioned bank 30 as a mask (see FIG. 8C). In addition, any one of the dry etching and the wet etching may be employed when the semiconductor 60a can remain right below the bank 30.

Process of Forming Electrode

Figure 9A:
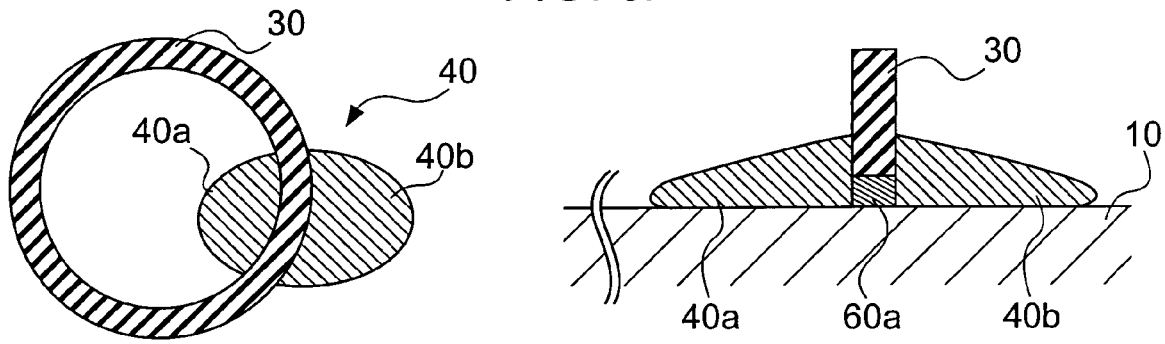
FIG. 9 is a diagram illustrating a process of manufacturing a thin film transistor according to the fourth embodiment.

When the etching process is finished, the electrode 40 is formed of aluminum or copper with a part of the bank 30 interposed between the electrodes (see FIG. 9A). Similar to the bank 30, the electrode 40 may be formed by ejecting a liquid material containing an electrode material from a nozzle of the inkjet head, or may be formed by using a vapor phase method, such as a PVD method and a CVD method. The substrate 10 on which the electrode material is applied is then fired, a source electrode 40a is formed at one side (for example, an inner side of the bank 30) and a drain electrode 40b is formed at the other side (for example, an outer side of the bank 30) with the bank 30 interposed therebetween.

Process of Removing Bank

Figure 9B:
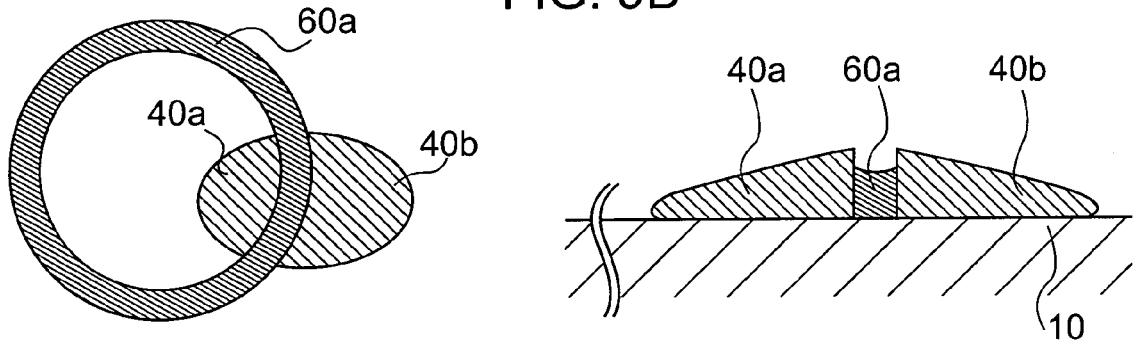

Next, when the electrode 40 is formed, the bank 30 is removed from the substrate 10 using the wet etching. As described above, since the semiconductor film 60a is located right below the bank 30, a semiconductor film is formed with the semiconductor film 60a interposed between the source electrode 40a and the drain electrode 40b after etching according to the width W0 of the bank 30 as shown in FIG. 9B. In addition, a dry etching method as well as the wet etching method may also be employed when the bank 30 can be removed from the substrate 10 by the dry etching method.

Process of Forming Gate Insulating Film

Figure 9C:
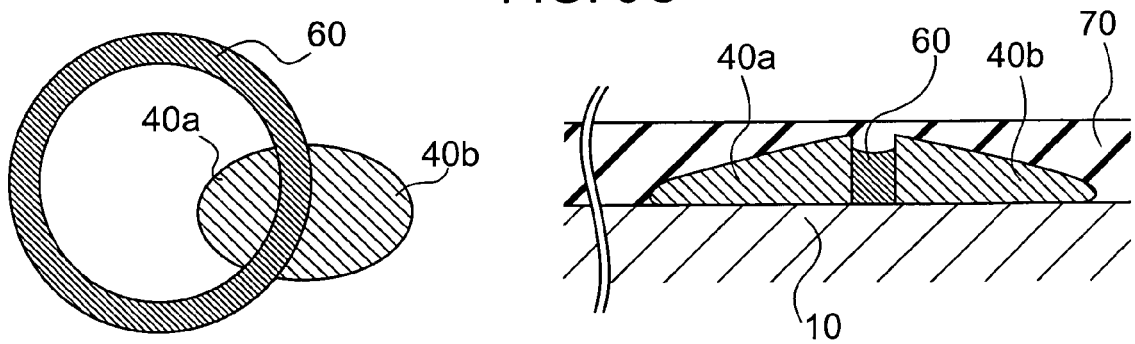

Next, a gate insulating film 70 is formed on one surface of the substrate 10 including the source electrode 40a, the semiconductor film 60, and the drain electrode 40b, which is polished to form a surface with high flatness (see FIG. 9C). A method of forming the gate insulating film 70 may include, for example, a method of applying a liquid material on the entire surface of the substrate 10 including the source electrode 40a, the semiconductor film 60, and the drain electrode 40b by means of the spin coating method and then firing the applied liquid material to be solidified. For example, the liquid material uses a material obtained by dissolving perhydropolysilazane with an organic solvent (for example, xylene solution of 20%), and this liquid material is applied by the spin coating method (for example, at 2000 rpm and for 20 seconds) and then fired in an atmosphere at a temperature of about 450° C., thereby forming a thick silicon oxide film (for example, gate insulating film 70). In addition, since the same description as the above-mentioned first embodiment can be applied to the gate insulating film 70, its description will be omitted.

Process of Forming Gate Electrode

Figure 9D:
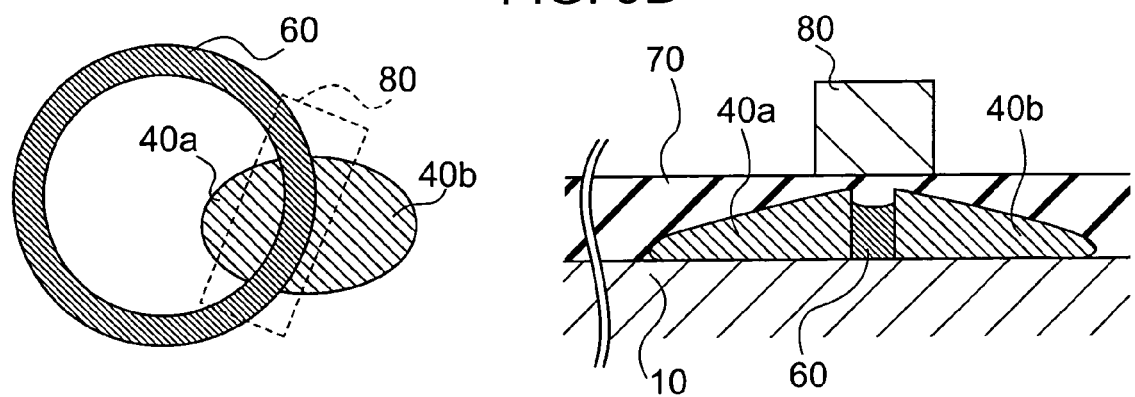

Next, a thin metal film made of tantalum, chromium, and aluminum is formed by a sputtering method and then patterned, so that a gate electrode 80 is formed at a position on the gate insulating film 70 facing the semiconductor film 60, as shown in FIG. 9D. In addition, a droplet ejection method or a CVD method may be employed to form the gate electrode 80 instead of the sputtering method.

By means of the above-described processes are carried out, a field effect type thin film transistor is obtained in which the semiconductor film, the gate insulating film, the electrode and so forth are stacked in response to the width W0 of the bank.

As such, the semiconductor film 60a to be a semiconductor film 60 may be formed on the substrate 10 in advance, and an unnecessary part may be removed by using the bank 30 as a mask. According to this structure, it is possible to more readily form the semiconductor film 60 as compared to a manufacturing process according to the first embodiment. In addition, a technical spirit of the second or third embodiment may be applied to the fourth embodiment described above. For example, the self-assembled monolayer 30a may be formed on the bank 30 (see the second embodiment), or a plurality of electrode pairs 40 each composed of the source electrode 40a and the drain electrode 40b may be formed with a part of the bank 30 interposed between the source and drain electrodes (see the third embodiment).

E. Fifth Embodiment

Next, specific examples of the electronic circuit, the electro-optical device, and the electronic device, which include the above-mentioned thin film transistor, will be described.

Figure 10:
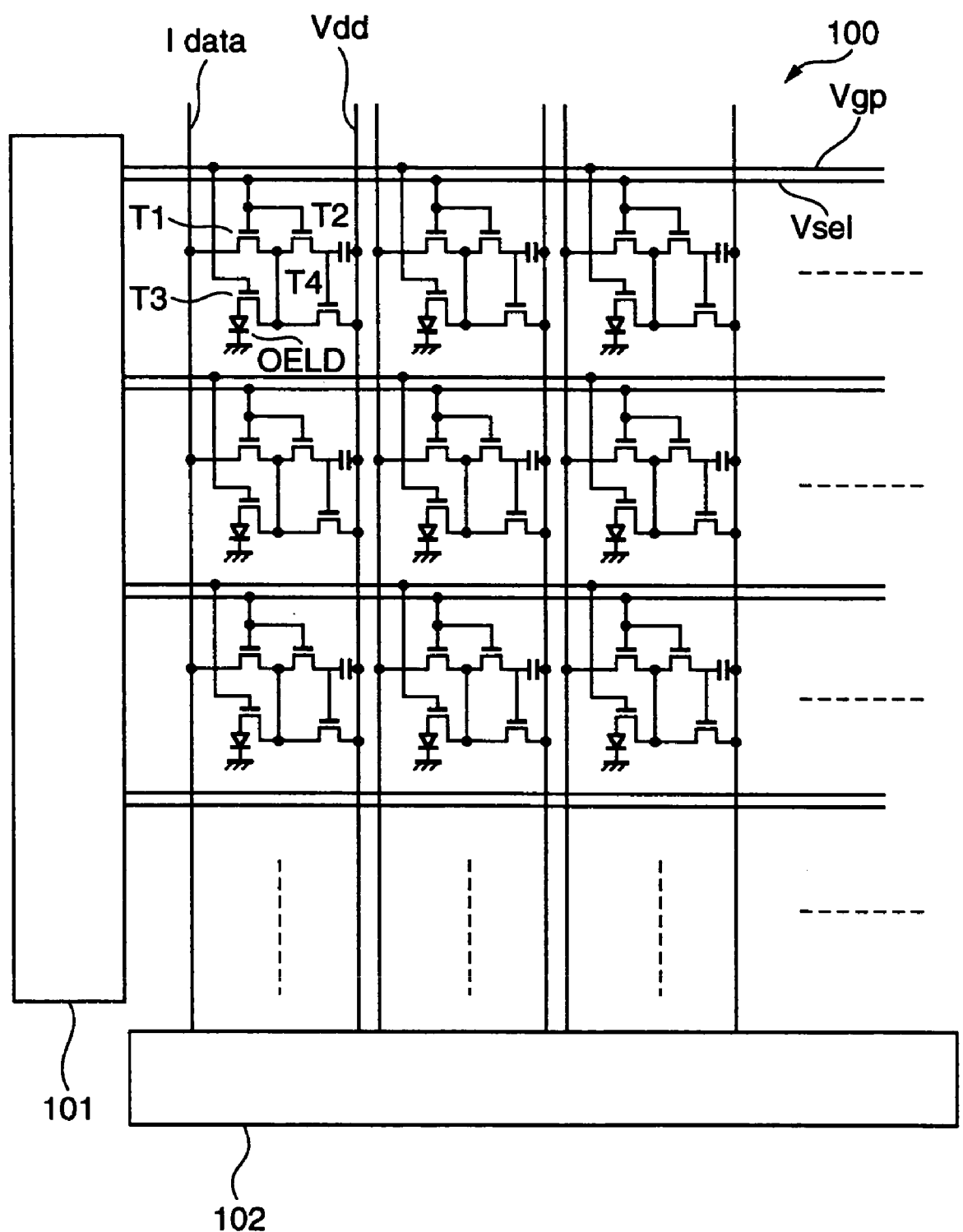
FIG. 10 is a circuit diagram of an electro-optical device including a thin film transistor according to the invention.
Figure 11A:
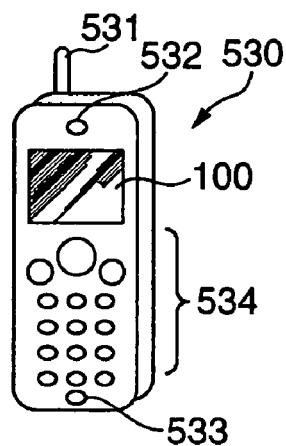
FIG. 11 is a diagram illustrating a specific example of an electronic device according to the invention.
Figure 11B:
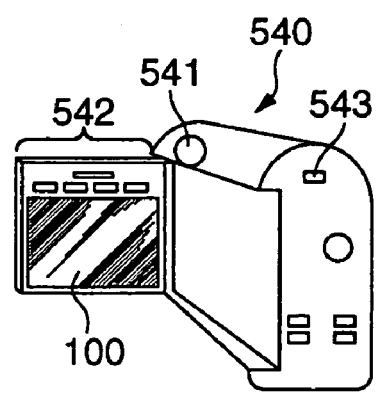
Figure 11C:
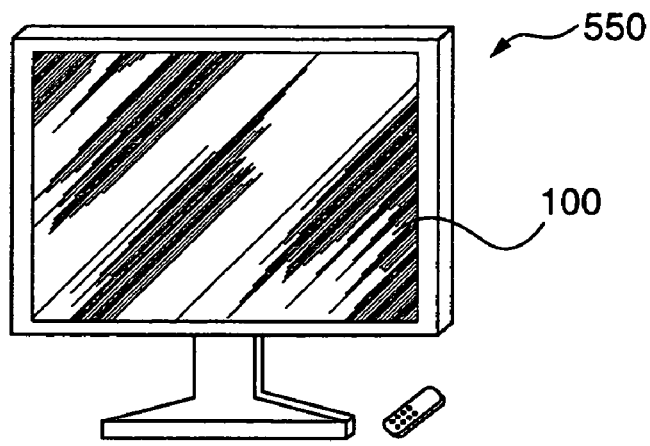
Figure 11D:
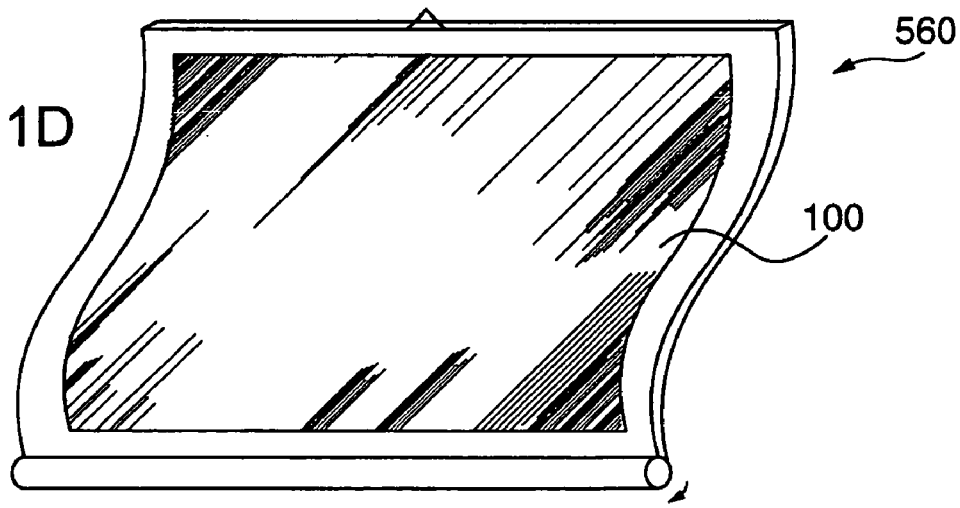
Figure 12:
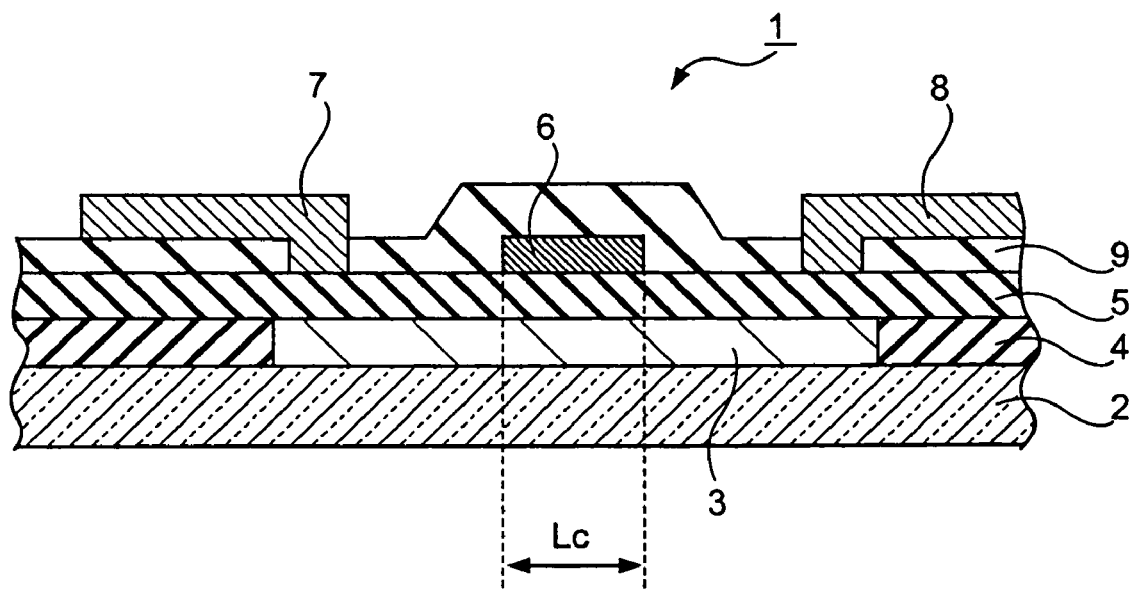
FIG. 12 is a diagram illustrating a structure of a typical MOS transistor.

FIG. 10 is a circuit diagram of an electro-optical device 100 including the thin film transistor of the invention. The electro-optical device (display device) 100 according to the present embodiment includes a light-emitting layer OELD capable of emitting light to each pixel region through an electroluminescent effect, a storage capacitor for storing a current for driving the light-emitting layer, and thin film transistors T1 to T4 according to the invention. A scanning line Vsel and a light-emitting control line Vgp are supplied to each pixel region from a driver 101. A data line Idata and a power line Vdd are supplied to each pixel region from a driver 102. By controlling the scanning line Vsel and the data line Idata, current program for each pixel region can run, and lights emitted from the light-emitting portion OELD can be controlled. In addition, the electro-optical device having the thin film transistor of the invention may include a liquid crystal display device, which includes the thin film transistor of the invention formed on one substrate of a pair of substrates with liquid crystal interposed therebetween so as to be electrically connected to a pixel electrode, and a counter electrode facing the pixel electrode formed on the other substrate.

In this case, the driving circuit is an example of a circuit when the light-emitting diode is used as the light-emitting element, and another circuit structure is also possible. In addition, it is preferable that an electronic circuit constituting each of the drivers 101 and 102 be formed of the thin film transistor according to the invention.

FIG. 11 is a diagram illustrating specific examples of an electronic device including the above-mentioned electro-optical device. FIG. 11A shows an application example of a cellular phone, and this cellular phone 530 includes an antenna unit 531, a voice output unit 532, a voice input unit 533, an operation unit 534, and an electro-optical device 100 having the thin film transistor of the invention. The electro-optical device having the thin film transistor according to the invention can be used as a display unit. FIG. 11B shows an application example of a video camera, and this video camera 540 includes an image receiving unit 541, an operation unit 542, a voice input unit 543, and an electro-optical device 100 having the thin film transistor of the invention. FIG. 11C shows an application example of a television, and this television 550 includes an electro-optical device 100 of the invention. In addition, the electronic device may be equally applied to a monitor used for a personal computer and the like. FIG. 11D shows an application example of a roll-up television, and this roll-up television 560 includes an electro-optical device 100 having the thin film transistor of the invention. In addition, the electronic device is not limited thereto, and can be applied to various electronic apparatuses each having a display function. For example, besides the above-described examples, a facsimile having a display function, a finder of a digital camera, a portable TV, an electronic note, an electric bulletin board, an ad and public announcement display and so forth may be employed. In addition, besides that the thin film transistor according to the invention is included in the electronic device as a component of the electro-optical device, the thin film transistor itself can be applied as a component of the electronic device.

In addition, the method of manufacturing the thin film transistor is not limited to the above-mentioned examples, and may be applied to manufacturing various electronic devices. For example, besides the above-mentioned examples, a facsimile having a display function, a finder of a digital camera, a portable TV, a PDA, an electronic note, an electric bulletin board, an ad and public announcement display, an IC card and so forth may be employed.

What is claimed is:

1. A method of manufacturing a transistor that includes a first conductive region, a second conductive region and a channel region positioned between the first conductive region and the second conductive region, the method comprising:
    forming a semiconductor film on a substrate;
    disposing a bank material on the semiconductor film;
    forming a bank by drying the bank material;
    forming the channel region by etching the semiconductor film by using the bank as a mask;
    ejecting a conductive material to the bank, the conductive material forming the first conductive region and the second conductive region;
    exposing the channel region by removing the bank;
    forming a gate insulating film on the channel region; and
    forming a gate electrode on the gate insulating film.

2. The method of manufacturing a transistor according to claim 1, wherein the forming of the bank includes forming the bank at the periphery of a center of the bank material and the periphery surrounding the center.

3. The method of manufacturing a transistor according to claim 1, wherein the forming of the bank includes forming a surface modifying film on the bank, and an affinity of the surface modifying film to the conductive material is lower than an affinity of the bank to the conductive material.

4. The method of manufacturing a transistor according to claim 1, a thickness from a surface of the substrate to a top of the bank being larger than a thickness of the first conductive region and a thickness of the second conductive region.

5. The method of manufacturing a transistor according to claim 1, a height of the semiconductor film being less than a height of the first conductive region and a height of the second conductive region.

* * * * *